(12) United States Patent
Zhang et al.

(10) Patent No.: US 9,373,546 B2
(45) Date of Patent: Jun. 21, 2016

(54) SELF ALIGNED REPLACEMENT FIN FORMATION

(71) Applicant: Applied Materials, Inc., Santa Clara, CA (US)

(72) Inventors: Ying Zhang, Santa Clara, CA (US); Hua Chung, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 14/864,389

(22) Filed: Sep. 24, 2015

(65) Prior Publication Data

US 2016/0079126 A1    Mar. 17, 2016

Related U.S. Application Data

(63) Continuation of application No. 14/484,645, filed on Sep. 12, 2014, now Pat. No. 9,209,279.

(51) Int. Cl.
| | |
|---|---|
| *H01L 29/78* | (2006.01) |
| *H01L 21/8234* | (2006.01) |
| *H01L 29/66* | (2006.01) |
| *H01L 21/02* | (2006.01) |
| *H01L 27/12* | (2006.01) |
| *H01L 21/311* | (2006.01) |

(52) U.S. Cl.
CPC .. *H01L 21/823431* (2013.01); *H01L 21/02381* (2013.01); *H01L 21/02532* (2013.01); *H01L 21/02538* (2013.01); *H01L 21/02587* (2013.01); *H01L 21/02658* (2013.01); *H01L 21/02664* (2013.01); *H01L 21/31116* (2013.01); *H01L 27/1211* (2013.01); *H01L 29/66795* (2013.01); *H01L 29/785* (2013.01)

(58) Field of Classification Search
CPC ............... H01L 21/02518; H01L 21/8232; H01L 29/7856
See application file for complete search history.

(56) References Cited

U.S. PATENT DOCUMENTS

| | | | |
|---|---|---|---|
| 8,586,449 B1 * | 11/2013 | Chang | H01L 21/845 257/296 |
| 2007/0292996 A1 | 12/2007 | Abadeer et al. | |
| 2011/0129978 A1 | 6/2011 | Cheng et al. | |
| 2012/0235247 A1 | 9/2012 | Cai et al. | |
| 2014/0110817 A1 | 4/2014 | Bergendahl et al. | |

(Continued)

FOREIGN PATENT DOCUMENTS

KR    1020080023814    3/2008

OTHER PUBLICATIONS

Office Action for U.S. Appl. No. 14/484,645 dated Aug. 28, 2015.

(Continued)

*Primary Examiner* — Cheung Lee
(74) *Attorney, Agent, or Firm* — Patterson & Sheridan, LLP

(57) ABSTRACT

Methods and apparatus for forming FinFET structures are provided. Selective etching and deposition processes described herein may provide for FinFET manufacturing without the utilization of multiple patterning processes. Embodiments described herein also provide for fin material manufacturing methods for transitioning from silicon to III-V materials while maintaining acceptable crystal lattice orientations of the various materials utilized. Further embodiments provide etching apparatus which may be utilized to perform the methods described herein.

19 Claims, 7 Drawing Sheets

(56) References Cited

U.S. PATENT DOCUMENTS

2014/0213033 A1 7/2014 Brunco et al.
2015/0145008 A1 5/2015 Cheng et al.

OTHER PUBLICATIONS

International Search Report and Written Opinion for International Application No. PCT/US2015/042196 dated Oct. 29, 2015.

* cited by examiner

SELF ALIGNED REPLACEMENT FIN FORMATION

CROSS-REFERENCE TO RELATED APPLICATIONS

This application is a continuation of and claims benefit to U.S. patent application Ser. No. 14/484,645, filed Sep. 12, 2014, the entirety of which is herein incorporated by reference.

BACKGROUND

1. Field

Embodiments of the present disclosure generally relate to methods and apparatus for forming fin field-effect transistor (FinFETs) structures. More specifically, embodiments described herein relate to self aligned replacement fin structure formation.

2. Description of the Related Art

In response to an increased need for smaller electronic devices with denser circuits, devices with three dimensional (3D) structures have been developed. An example of such devices may include FinFETs having conductive fin-like structures that are raised vertically above a horizontally extending substrate. Conventional FinFETs may be formed on a substrate, such as a semiconducting substrate or silicon-on-insulator substrates. The substrate may comprise a semiconducting substrate and an oxide layer disposed on the semiconducting substrate.

When manufacturing FinFETs, it is desirable to have a fin structure with a high aspect ratio. A higher aspect ratio for the fin structure allows a larger amount of current to be provided through the same amount of topographical area. Fabrication of high aspect ratio FinFETs is difficult as a result of the reduced critical dimensions required for sub-10 nm nodes. Forming sub-10 nm node FinFET structures is further complicated by limitations and increased complexities of various patterning and lithography processes. For example, multiple patterning processes, such as self-aligned double patterning (SADP) and self-aligned quadruple patterning (SAQP) processes, may not adequately provide reliable patterning given the small pitch size requirements associated with formation of sub-10 nm node FinFET structures. Moreover, current lithography and patterning processes are time consuming, which reduces throughput for device processing.

Thus, what is needed in the art are methods and apparatus for manufacturing FinFET structures.

SUMMARY

In one embodiment, a method for forming a FinFET structure is provided. The method includes forming at least a first mandrel structure and a second mandrel structure having a first pitch size on a substrate. The first mandrel structure and the second mandrel structure may define a recess and a first fin material layer may be conformally deposited within the recess. The first mandrel structure and the second mandrel structure may be removed to form at least a first fin structure and a second fin structure. The first fin structure and the second fin structure may have a second pitch size less than the first pitch size. A dielectric layer may also be deposited over the first fin material layer and the substrate.

In another embodiment, a method of forming a semiconductor device is provided. The method includes forming a plurality of mandrel structures having sidewalls on a substrate and depositing a first fin material on the sidewalls of the plurality of mandrel structures to form a plurality of first fin structures. The plurality of mandrel structures may be removed and a second fin material may be deposited on sidewalls of the plurality of first fin structures to form a plurality of second fin structures. The plurality of first fin structures may be removed and a mask may be deposited on a region of the plurality of second fin structures. A third fin material may be deposited on sidewalls of the plurality of second fin structures in an unmasked region to form a plurality of third fin structures. The plurality of second fin structures may be removed from the unmasked region and the mask may also be removed.

In yet another embodiment, a method of forming a semiconductor device is provided. The method includes etching a substrate in a first material removal chamber to form a plurality of mandrel structures and depositing a first fin material on the substrate in a first material deposition chamber. The plurality of mandrel structures may be removed in the first material removal chamber and an oxide material may be deposited on the substrate in a second material deposition chamber. A portion of the oxide material may be removed in the first material removal chamber and a second fin material may be deposited on the substrate in the first material deposition chamber. The first fin material may be removed in a second material removal chamber and a mask material may be deposited on the substrate in a third material deposition chamber. A third fin material may be deposited on the substrate in the first material deposition chamber and the second fin material may be removed in the second material removal chamber. The mask material may be removed in a third material removal chamber.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

The present disclosure generally relates to methods and apparatus for forming FinFET structures. Selective etching and deposition processes described herein may provide for FinFET manufacturing without the utilization of multiple patterning processes. Embodiments described herein also provide for fin structure manufacturing methods for transitioning from silicon to III-V materials while maintaining acceptable crystal lattice orientations of the various materials utilized. Further embodiments provide etching apparatus which may be utilized to perform the methods described herein.

Figure 1:
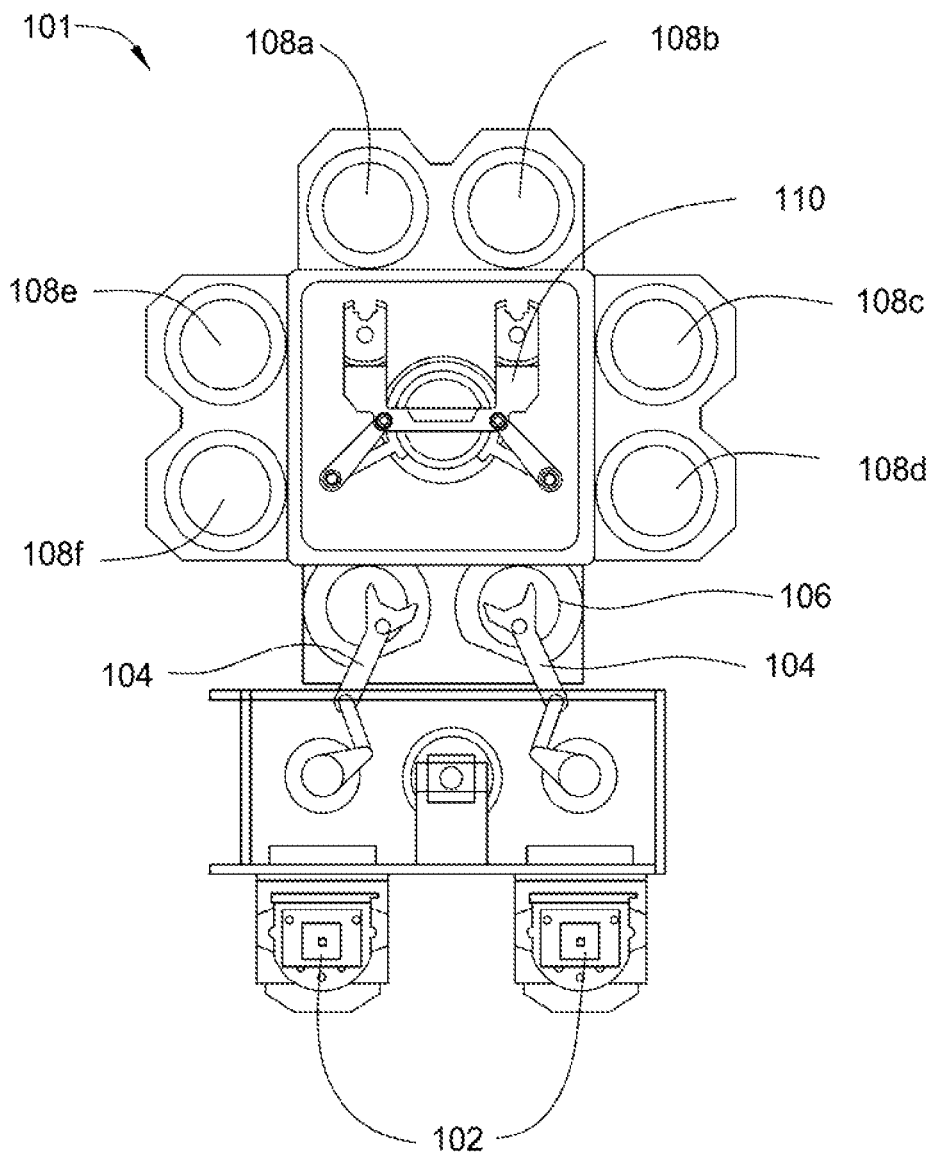
FIG. 1 illustrates a schematic, plan view of an exemplary processing system in which embodiments of the disclosure may be practiced.

FIG. 1 illustrates a schematic, plan view of a processing system 101 which may be utilized to perform the methods described herein. The processing system 101 may perform various processes, such as deposition processes, etching processes, and baking and curing processes, among others. The system 101 includes a pair of front opening unified pods 102. Substrates are generally provided from the front opening unified pods 102. One or more first robots 104 retrieve the substrates from the front opening unified pods 102 and place the substrates into a low pressure holding area 106. One or more second robots 110 transport the substrates from the low pressure holding area 106 to one or more processing chambers 108a-108f. Each of the processing chambers 108a-108f may be configured to perform a number of substrate processing operations, such as dry etching, epitaxial layer deposition, atomic layer deposition (ALD), chemical vapor deposition (CVD), physical vapor deposition (PVD), pre-clean, degas, orientation, and other substrate processes.

The substrate processing chambers 108a-108f may include one or more system components for depositing, annealing, curing and/or etching a material deposited on a substrate. In one configuration, two pairs of the processing chambers, for example, 108c-108d and 108e-108f, may be used to deposit a material on the substrate, and the third pair of processing chambers, for example, 108a-108b, may be used to remove material from the substrate. In another configuration, all of the processing chambers 108a-108f may be configured to remove material from the substrate. In this configuration, each pair of processing chambers, 108a-108b, 108c-108d, 108e-108f, may be configured to perform a selective etching process.

In one embodiment, processing chambers 108a-108b may be configured to selectively etch silicon and various hardmask materials utilizing a dry plasma etching process. Processing chambers 108c-108d may be configured to selectively etch semiconducting materials, such as silicon, silicon germanium, germanium, and III-V material, utilizing a dry plasma etching process. Processing chambers 108e-108f may be configured to selectively remove mask materials in a low temperature process. In one embodiment, the processing chambers 108e-108f utilize an electron beam to form a plasma. The processing system 101 described herein may be utilized to perform the processes described herein. Additionally, any one or more of the processes described herein may be performed in chamber(s) separated from the processing system 101.

Figure 2:
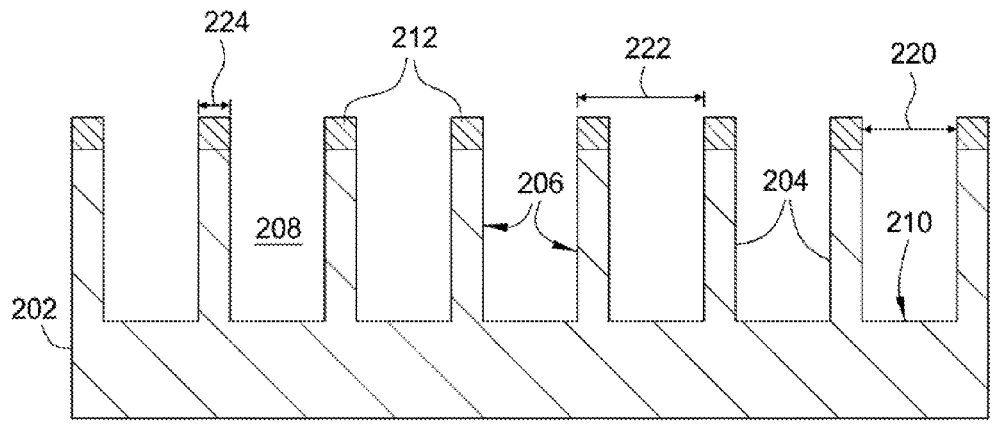
FIG. 2 illustrates a partial, cross-sectional view of a substrate.

FIG. 2 illustrates a partial, cross-sectional view of a substrate 202. The substrate 202 comprises a semiconducting material, such as silicon, and may be a silicon-on-insulator substrate. The substrate 202 may comprise a monocrystalline silicon material which is either an intrinsic (un-doped) silicon material or an extrinsic (doped) silicon material. If an extrinsic silicon material is utilized, the dopant may be a p-type dopant, such as boron.

In the example illustrated in FIG. 2, the substrate 202 has been previously patterned. In the patterning process, such as a 193 nm immersion lithography process or directed self assembly (DSA) process, the substrate 202 was patterned and a hardmask layer 212 remains disposed on one or more mandrel structures 204. The mandrel structures 204 are formed from the same material as the substrate 202, for example, silicon. In one example, the hardmask layer 212 comprises a silicon nitride material, however other hardmask layers which are capable of functioning as an etch stop may also be utilized. For example, depending upon pitch size and the lithography processes performed, more complex stack layers may be utilized as the hardmask layer 212. The hardmask layer 212 may have a thickness of between about 20 nm and about 40 nm, such as about 30 nm, however, any suitable thickness may be utilized.

The mandrel structures 204 formed after an etching process generally define one or more first recesses 208 between adjacent mandrel structures 204. The etching process may be performed in a first material removal chamber, such as the chamber 108e-108f. Another example of a chamber which may be utilized to perform the etching processes described above is the MESA™ etch chamber available from Applied Materials, Inc., Santa Clara, Calif. The first recesses 208 are defined by sidewalls 206 of the mandrel structures 204 and a bottom surface 210. A width 220 of each of the first recesses 208 may be between about 20 nm and about 40 nm, such as about 30 nm. A width 224 of each of the mandrel structures 204 may be between about 5 nm and about 15 nm, such as about 10 nm. A first pitch size 222 (the sum of the first recess width and the mandrel structure width) may be between about 25 nm and about 55 nm, such as about 40 nm. It is contemplated that the dimensions of the mandrel structures 204 and the recesses 208 may be formed by a single patterning process as mentioned above and subsequent lithographic patterning processes may not be necessary to form FinFET structure as described in the embodiments below.

Figure 3:
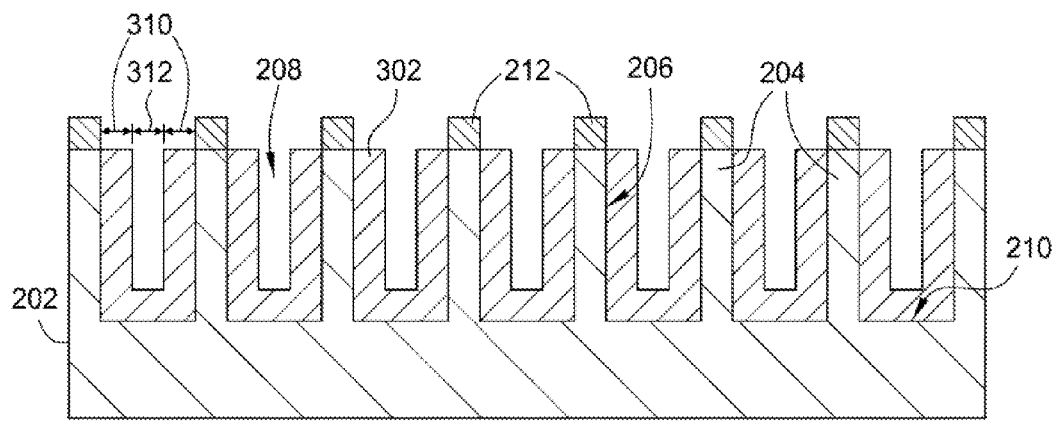
FIG. 3 illustrates a partial, cross-sectional view of a substrate having one or more first fin structures formed thereon.

FIG. 3 illustrates a partial, cross-sectional view of the substrate 202 having one or more first fin structures 302 formed thereon. The first fin structures 302 are conformally deposited within the first recesses 208. As such, the first fin structures 302 are grown from the sidewalls 206 and bottom surface 210 of the recesses 208. In one example, the first fin structures 302 are formed by an epitaxial deposition process. A chamber suitable for performing the epitaxial deposition process is the CENTURA® RP EPI chamber available from Applied Materials, Inc., Santa Clara, Calif. However, it is contemplated that other chambers from other manufacturers may also perform the processes described.

The material of the first fin structures 302 may be selected to be compatible with the material of the substrate 202 and mandrel structures 204. The first fin structure material is generally selected to minimize lattice mismatches and dislocations which may be generated at the interface of the first fin structures 302 and the substrate 202 and the mandrel structures 204. For example, if the substrate 202 and the mandrel structures 204 are formed from silicon, the first fin structures 302 may be formed from a silicon germanium (SiGe) material, however, other suitable materials may also be utilized.

The first fin structures 302 may be deposited in a manner such that the resulting dimensions of the first fin structures 302 are suitable for forming advanced node FinFET structures. The first fin structures 302 are generally defined as vertically extending fins having defined dimensions. A width 310 of a single first fin structure 302 may be between about 5 nm and about 15 nm, such as about 10 nm. A distance 312 between adjacent first fin structures 302 may be between about 5 nm and about 15 nm, such as about 10 nm.

Figure 4:
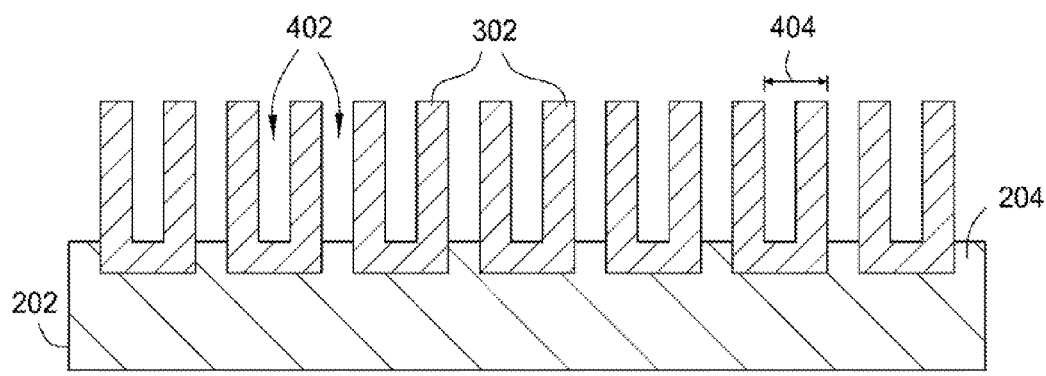
FIG. 4 illustrates a partial, cross-sectional view of a substrate having first fin structures formed thereon after removal of mandrel structures.

FIG. 4 illustrates a partial, cross-sectional view of the substrate 202 having the first fin structures 302 formed thereon after removal of the mandrel structures 204. The mandrel structures 204 illustrated in FIG. 3 may be removed by a selective etching process. The hardmask layer 212 and the mandrel structures 204 may be removed in a single etching process or in separate etching processes. In one example, the hardmask layer 212 and the mandrel structures are removed in a single etching process in a single chamber, such as one of the chambers 108e-108f. In another example, the hardmask layer 212 is removed in a first chamber, such as one of the chambers 108e-108f, and the mandrel structures 204 are removed in a second chamber, such as one of the chambers 108a-108b.

The hardmask layer 212 etching process may be a wet etching process or a dry etching process. In one example, the hardmask layer 212 is removed by a dry plasma etching process. Suitable process gases for forming the plasma include fluorocarbon gases, such as $CF_4$, $CHF_3$, and the like. In one example, the hardmask etching process may be performed with a source power of about 500 W and a bias power of about 100 W in an environment having a pressure less than about 20 mtorr.

The mandrel structures 204 may also be removed with a selective dry plasma etching process utilizing desirable process gases, such as chlorine or bromine gases, to form a suitable etching plasma. The mandrel structure etching process may be a time dependent anisotropic etching process. In one example, the mandrel structure etching process may be performed with a source power of about 1 kW and a bias of between about 100 W to about 1000 W, such as between about 200 W and about 600 W, in an environment having a pressure less than about 20 mtorr. As such, the mandrel structures 204 are predominantly removed, which results in the first fin structures 302 extending vertically from the substrate 202. The mandrel structure etching process may proceed for amount of time such that a portion of the mandrel structures 204 remain between adjacent first fin structures 302. The mandrel structures 204 may be optionally exposed to oxygen to in a sidewall passivation process.

The removal of the mandrel structures 204 results in the formation of one or more second recesses 402. The second recesses 402 are generally defined between adjacent first fin structures 302. A second pitch size 404 defined by the first fin structures 302 may be between about 10 nm and about 30 nm, such as about 20 nm. The second pitch size 404 is the summation of the width 310 and the distance 312. In one embodiment, the second pitch size 404 is about half of the first pitch size 222.

Figure 5:
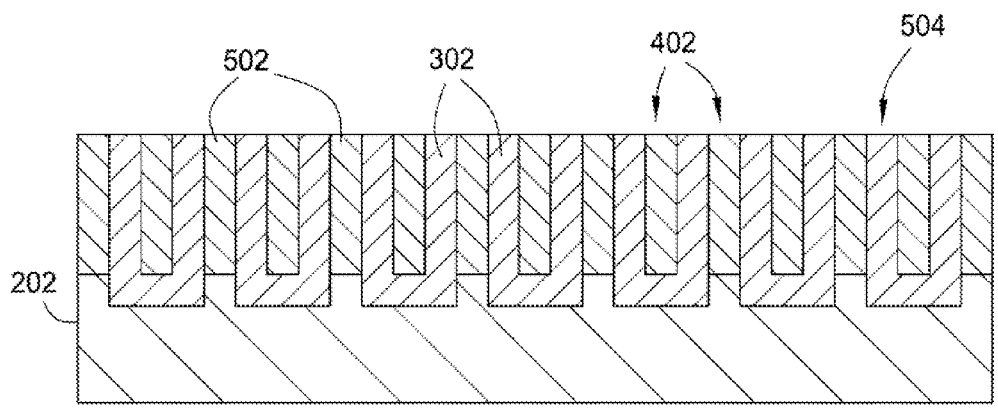
FIG. 5 illustrates a partial, cross-sectional view of a substrate having first fin structures formed thereon after a dielectric deposition process.

FIG. 5 illustrates a partial, cross-sectional view of the substrate 202 having the first fin structures 302 formed thereon and a dielectric layer 502 disposed on the substrate 202. FIGS. 5-12 illustrate one embodiment of forming replacement fin structures for CMOS (complimentary metal-oxide-semiconductor) devices. The dielectric layer 502 may be an oxide material and may be deposited over the substrate 202 and the first fin structures 302 such that the dielectric layer 502 fills the second recesses 402. The dielectric layer deposition process may be formed by a flowable or a flow-like CVD process. The dielectric layer 502 is typically formed using a blanket deposition technique, filling the second recesses 402 and covering the first fin structures 302.

In one example of a flowable CVD process, an organosilicon precursor and an oxygen precursor at a temperature of about 100° C. or less may be provided form a flowable oxide layer. Suitable organosilicon precursors have a ratio of carbon atoms to silicon atoms less than 8. Suitable organosilicon compounds may also have a ratio of oxygen to silicon atoms of 0 to about 6, and may include an Si—O—Si linkage that facilitates formation of $SiO_x$ films with reduced contamination from carbon and hydroxyl groups. Suitable oxygen precursors may include molecular oxygen ($O_2$), ozone ($O_3$), a nitrogen-oxygen compound such as NO, $NO_2$, or $N_2O$, a hydrogen-oxygen compound such as water or peroxide, a carbon-oxygen compound such as carbon monoxide or carbon dioxide, and other oxygen-containing precursors.

A carrier gas, for example, an inert gas, may also be provided with the organosilicon and oxygen precursors. The oxygen precursor may be activated prior to introduction to the chamber, for example using a remote plasma generator, which may include thermal dissociation, ultraviolet light dissociation, RF, DC, and/or microwave dissociation. In one embodiment, about 4-6 kW of RF power may be coupled into a flow of about 900-1,800 sccm of argon and about 600-1,200 sccm of molecular oxygen. The organosilicon precursor may be provided to the chamber separately from the oxygen precursor to prevent reactions outside the chamber. The organosilicon precursor may be introduced as a gas to the chamber at a liquid-equivalent flow rate of about 800 mgm to about 1,600 mgm. Helium may be included as a carrier gas at a flow rate of about 600 sccm to about 2,400 sccm. An activated oxygen precursor may be introduced to the chamber at a flow rate between about 3 sLm and about 20 sLm.

The precursors react to deposit a flowable oxide layer, or dielectric layer 502, on the substrate 202. The CVD process described above may be implemented on a PRODUCER® CVD system available from Applied Materials, Inc., of Santa Clara, Calif. However, it is contemplated that other chambers from other manufacturers may also perform the processes described.

FIG. 5 additionally illustrates the dielectric layer 502 being coplanar with a top surface 504 of the first fin structures 302. The flowable dielectric deposition process will generally cover the top surface 504 prior to performing a planarization process which removes a portion of the dielectric layer 502 to planarize the dielectric layer 502. A CMP process may be utilized to planarize the dielectric layer 502. The CMP process is performed to polish the top surface of the substrate 202 such that the dielectric layer 502 is substantially co-planar with the top surface 504 of the first fin structures 302. In this embodiment, the top surface 504 of the first fin structures 302 may be utilized as a hard stop for the CMP process to determine a polishing end point. The CMP process may be implemented on a REFLEXION GT™ system or other similar systems available from Applied Materials, Inc., Santa Clara, Calif. However, it is contemplated that other chambers from other manufacturers may also perform the processes described.

Figure 6:
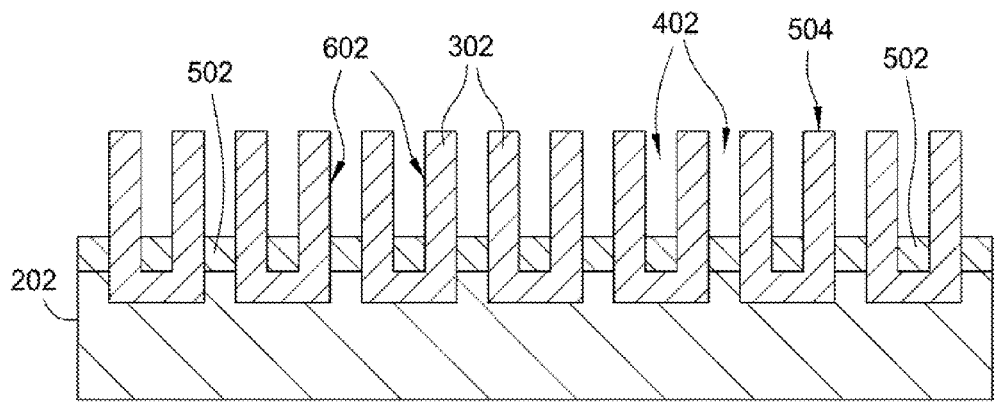
FIG. 6 illustrates a partial, cross-sectional view of a substrate having first fin structures formed thereon after a dielectric etching process.

FIG. 6 illustrates a partial, cross-sectional view of the substrate 202 and the first fin structures 302 formed thereon after a dielectric layer etching process. As illustrates, the dielectric layer 502 is recessed below the top surface 504 of the first fin structures 302 in the second recesses 402. In the embodiment illustrated, a portion of the dielectric layer 502 remains on the substrate 202 in the second recesses 402 between adjacent first fin structures 302. The dielectric layer etching process exposes sidewalls 602 of the first fin structures 302 which define the second recesses 402.

The dielectric layer etching process may be either a wet etch or dry etch. The dielectric layer etching process is generally selective to the material of the dielectric layer 502 such that the dielectric layer 502 predominantly is removed. The dielectric layer etching process may be a time dependent anisotropic etching process. In one example, the dielectric layer 502 is etched utilizing a dry etch process with a fluorocarbon containing plasma. A $CF_4$ process gas may be flowed at a rate of about 500 sccm in an environment having a pressure of about 7 mT. The $CF_4$ may be energized into a plasma with an RF power of about 500 W and a bias of less than about 200 W and the etching process may proceed for about 45 seconds. The dielectric layer etching process is generally selective to the material of the dielectric layer 502 such that the dielectric layer 502 is predominantly removed.

Figure 7:
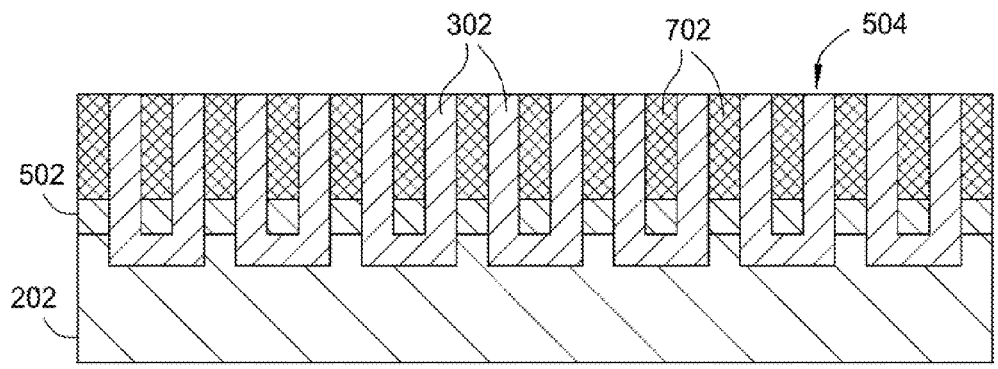
FIG. 7 illustrates a partial, cross-sectional view of a substrate having first fin structures formed thereon after a second fin structure deposition process.

FIG. 7 illustrates a partial, cross-sectional view of the substrate 202 having the first fin structures 302 formed thereon after a second fin structure deposition process. The second recesses 402 (See FIG. 6) are filled with a second fin material to form one or more second fin structures 702. The second fin structures 702 are grown from the sidewalls 602 of the first fin structures 302 to fill the second recesses 402. As such, the second fin material may nucleate on the sidewalls 602 and grow laterally to fill the second recesses 402 between the first fin structures 302.

The second fin structure material is generally selected to minimize lattice mismatches and dislocations which may be generated at the interface of the first fin structures 302, i.e. the sidewalls 602, and the second fin structures 702. For example, if the first fin structures 302 are formed from a silicon germanium material, the second fin structures 702 may be formed from a germanium (Ge) material, however, other suitable materials may also be utilized. In one example, the nucleation of the second fin structure material is limited to the sidewalls 602 of the first fin structures 302 due to the growth rate of the Ge material on the SiGe material, which may be a single crystal material. It is believed that the second fin structure material nucleation on the dielectric layer 502 may be reduced or eliminated as a result of the amorphous or nanocrystal phase of the second fin structure material on the dielectric layer 502, which may be an oxide material. A chlorine material, such as $CL_2$, may be provided in the processing chamber during the second fin structure material deposition process which results in removal of the amorphous and nanocrystal Ge material from the dielectric layer 502 at a rate faster than the Ge material growth rate on the first fin structures 302, which may be a single crystal material. In one embodiment, the second fin structures 702 are formed by a selective epitaxial deposition process. Suitable precursors for forming the second fin structures 702 include Ge containing gases, such as $GeH_4$. A chamber suitable for performing the epitaxial deposition process is a CENTURA® RP EPI chamber available from Applied Materials, Inc., Santa Clara, Calif. However, it is contemplated that other chambers from other manufacturers may also perform the processes described.

Figure 8:
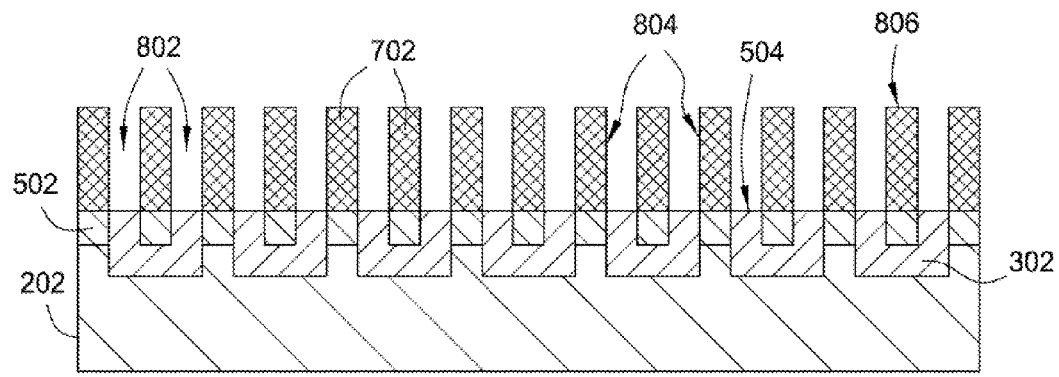
FIG. 8 illustrates a partial, cross-sectional view of a substrate having second fin structures formed thereon after a first fin structure etching process.

FIG. 8 illustrates a partial, cross-sectional view of the substrate 202 having the second fin structures 702 formed thereon after a first fin structure etching process. The first fin structures 302 may be selectively etched and recessed below a top surface 806 of the second fin structures 702. The selective etching of the first fin structures 302 results in the formation of one or more third recesses 802 which are generally defined by sidewalls 804 of the second fin structures 702.

The first fin structures 302 may be selectively etched such that the top surface 504 of the remaining portions of the first fin structures 302 are co-planar with the dielectric layer 502. The first fin structure etching process may be performed by a dry plasma etching process and may be a time dependent anisotropic etching process. Suitable precursors for forming a plasma to selectively etch the first fin structures 302 include fluorocarbon containing gases, such as $CF_4$, $CHF_3$, and the like. In one embodiment, the first fin structures 302 may be etched in a selective etching chamber, such as one of the chambers 108a-108b.

Figure 9:
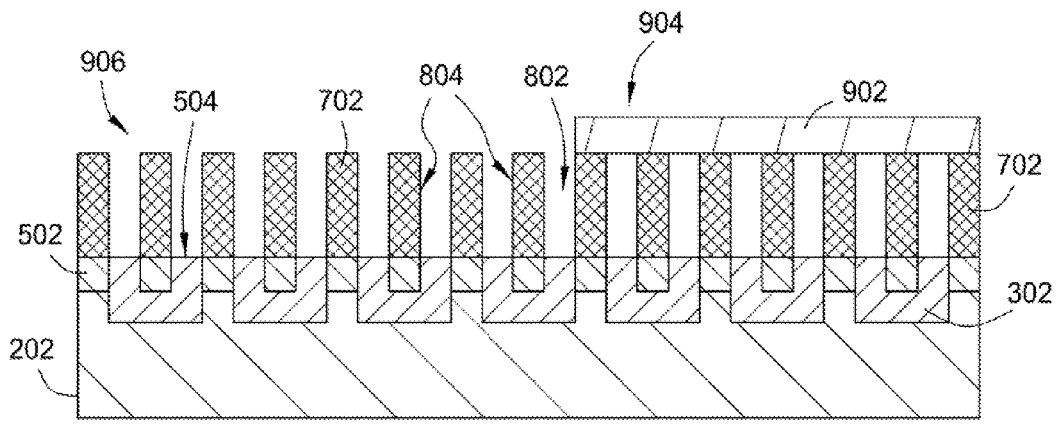
FIG. 9 illustrates a partial, cross-sectional view of a substrate having second fin structures formed thereon after a hardmask deposition process.

FIG. 9 illustrates a partial, cross-sectional view of the substrate 202 with the second fin structures 702 formed thereon after a hardmask deposition process. A hardmask layer 902 may be deposited over a portion of the substrate 202 to mask one or more of the second fin structures 702. Thus, a masked region 904 and an unmasked region 906 may be defined on the substrate. The second fin structures 702 disposed in the masked region 904 have the hardmask layer 902 disposed thereover and the second fin structures 702 in the unmasked region 906 are unmasked. The hardmask layer 902 may be formed from any suitable hardmask material, such as silicon nitride or the like.

Figure 10:
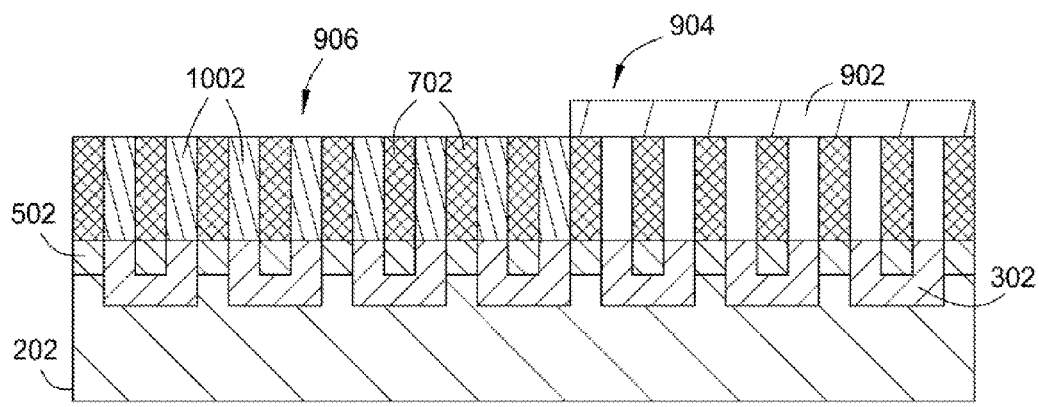
FIG. 10 illustrates a partial, cross-sectional view of a substrate having second fin structures formed thereon after a third fin structure deposition process.

FIG. 10 illustrates a partial, cross-sectional view of the substrate 202 having the second fin structures 702 formed thereon after a third fin structure deposition process. The third recesses 802 (See FIG. 9) in the unmasked region 906 are filled with a third fin material to form one or more third fin structures 1002. The third fin structures 1002 are grown from the sidewalls 804 of the second fin structures 702 to fill the third recesses 802. As such, the third fin material may nucleate on the sidewalls 804 and grow laterally to fill the third recesses 802 between the second fin structures 702 in the unmasked region 906. As illustrated, the third recesses 802 in the masked region 904 covered by the hardmask layer 902 are not filled with the third fin structure material.

The third fin structure material is generally selected to minimize lattice mismatches and dislocations which may be generated at the interface of the second fin structures 702, i.e. the sidewalls 804, and the third fin structures 1002. For example, if the second fin structures 702 are formed from a germanium material, the third fin structures 1002 may be formed from a III-V material, however, other suitable materials may also be utilized. As such, the material of the third fin structures 1002 is predominantly limited to the sidewalls 804 of the second fin structures 702. It is believed that the third fin structure material nucleation on the dielectric layer 502 may be reduced or eliminated as a result of the amorphous or nano-crystal phase of the third fin structure material on the dielectric layer 502, which may be an oxide material. A chlorine material, such as $CL_2$, may be provided in the processing chamber during the third fin structure material deposition process which results in removal of the amorphous and nano-crystal III-V material from the dielectric layer 502 at a rate faster than the III-V material growth rate on the second fin structures 702, which may be a single crystal material. In one example, the third fin structures 1002 are formed by a selective epitaxial deposition process. A chamber suitable for performing the epitaxial deposition process is a CENTURA® RP EPI chamber available from Applied Materials, Inc., Santa Clara, Calif. However, it is contemplated that other chambers from other manufacturers may also perform the processes described.

Figure 11:
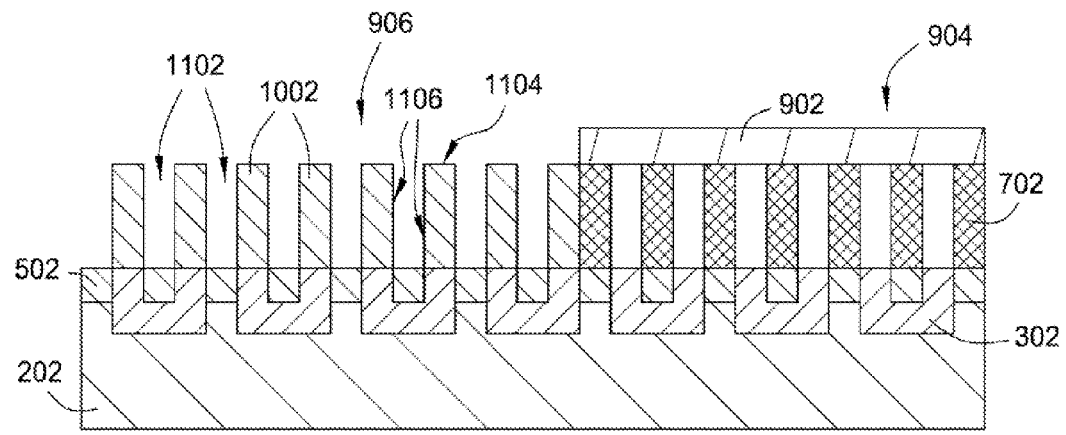
FIG. 11 illustrates a partial, cross-sectional view of a substrate having second fin structures and third fin structures formed thereon after a second fin structure etching process.

FIG. 11 illustrates a partial, cross-sectional view of the substrate 202 having the second fin structures 702 and the third fin structures 1002 formed thereon after a second fin structure etching process. The second fin structures 702 may be selectively etched and recessed below a top surface 1104 of the third fin structures 1002 in the unmasked region 906. The hardmask layer 902 covering the second fin structures 702 in the masked region 904 prevents etching of the second fin structures 702 in the masked region 904. The selective etching of the second fin structures 702 results in the formation of one or more fourth recesses 1102 which are generally defined by sidewalls 1106 of the third fin structures 1002.

The second fin structures 702 in the unmasked region 906 may be selectively etched such that the dielectric layer 502 disposed within the fourth recesses 1102 is exposed. The second fin structure etching process may be performed by a dry plasma etching process and may be a time dependent anisotropic etching process. The dielectric layer 502 may also serve as an endpoint material for stopping the second fin structure etching process. Suitable precursors for forming a plasma to selectively etch the first fin structures 302 include fluorocarbon containing gases, such as $CF_4$, $CHF_3$, and chlorine containing gases, such as $CL_2$. Oxygen containing gases, such as $O_2$, and nitrogen containing gases, such as $N_2$, may also be utilized to enhance etch selectivity. In one embodiment, the second fin structures 702 in the unmasked region 906 may be etched in a selective etching chamber, such as one of the chambers 108a-108b.

Figure 12:
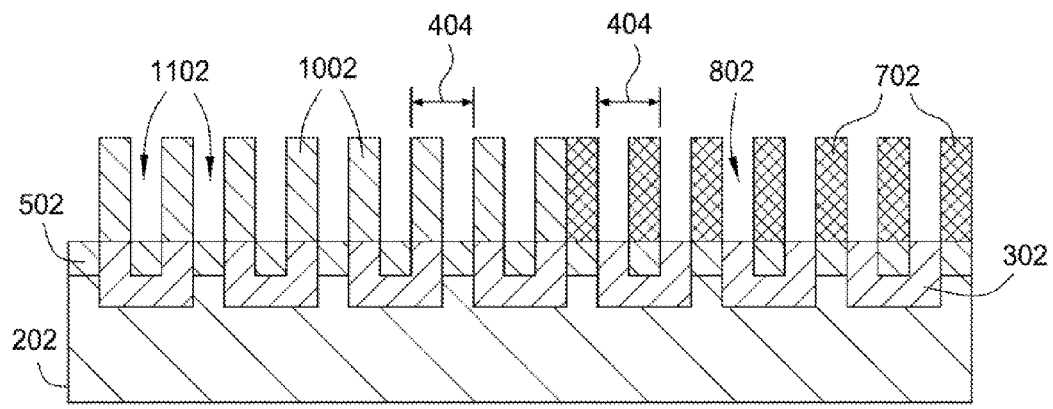
FIG. 12 illustrates a partial, cross-sectional view of a substrate having second fin structures and third fin structures formed thereon after a hardmask removal process.

FIG. 12 illustrates a partial, cross-sectional view of the substrate 202 having the second fin structures 702 and the third fin structures 1002 formed thereon after a hardmask removal process. The hardmask layer 902 (See FIG. 11) may be removed to expose the second fin structures 702. The hardmask layer 902 may be removed by a selective dry plasma etching process. The hardmask layer removal process may be a low temperature etching process utilizing an electron beam to form the plasma. Various precursors suitable for removing the hardmask layer 902 include fluorine and oxygen containing gases, such as $CH_2F_2$, $O_2$, and the like. The plasma is generally selective for the hardmask layer material, such as silicon nitride, and may utilize the second fin structures 702 as an etch stop. In one embodiment, the hardmask layer 902 may be removed in a low electron temperature chamber, such as one of the chambers 108c-108d.

As a result of the hardmask layer removal process, the substrate 202 has the second fin structures 702 formed thereon which define the third recesses 802 and the third fin structures 1002 formed thereon which define the fourth recesses 1102. The second fin structures 702 may be suitable for forming a Pfet structure and the third fin structures 1002 may be suitable for forming an Nfet structure in a CMOS device. As illustrated, the second pitch size 404 is maintained for both the second fin structures 702 and the third fin structures 1002 without utilizing multiple patterning lithography techniques. Additionally, the materials utilized to form the fin structures may transition from a silicon material to a III-V material in a manner that minimizes or prevents crystallographic dislocations and mismatches while forming suitable Pfet and Nfet structures.

Figure 13:
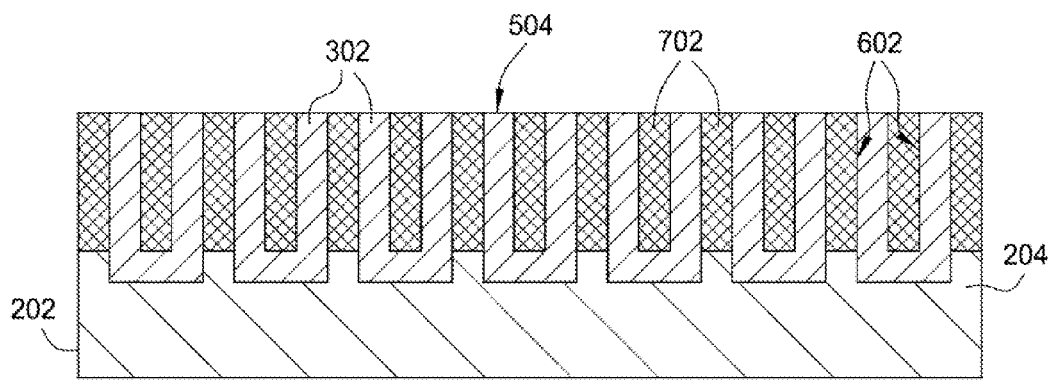
FIG. 13 illustrates a partial, cross-sectional view of a substrate having first fin structures formed thereon after a second fin structure deposition process.

FIGS. 13-19 illustrate another embodiment of forming replacement fin structures for CMOS devices. FIG. 13 illustrates a partial, cross-sectional view of the substrate 202 having the first fin structures 302 formed thereon after a second fin structure deposition process and a processing operation performed immediately after the operations described with reference in FIG. 4. As illustrated in FIG. 13, the second fin structure material may be deposited over the substrate 202 and the first fin structures 302 within the first recesses 208.

The second fin structure material is generally selected to minimize lattice mismatches and dislocations which may be generated at the interface of the first fin structures 302, i.e. the sidewalls 602, and the second fin structures 702. For example, if the first fin structures 302 are formed from a silicon material, the second fin structures 702 may be formed from a germanium material, however, other suitable materials may also be utilized. As such, nucleation of the second fin structure material on the recessed mandrel structures 204 is limited; rather, the nucleation of the second fin structure material is predominantly on the sidewalls 602 of the first fin structures 302. In one example, the second fin structures 702 are formed by an epitaxial deposition process. A chamber suitable for performing the epitaxial deposition process is a CENTURA® RP EPI chamber available from Applied Materials, Inc., Santa Clara, Calif. However, it is contemplated that other chambers from other manufacturers may also perform the processes described.

Figure 14:
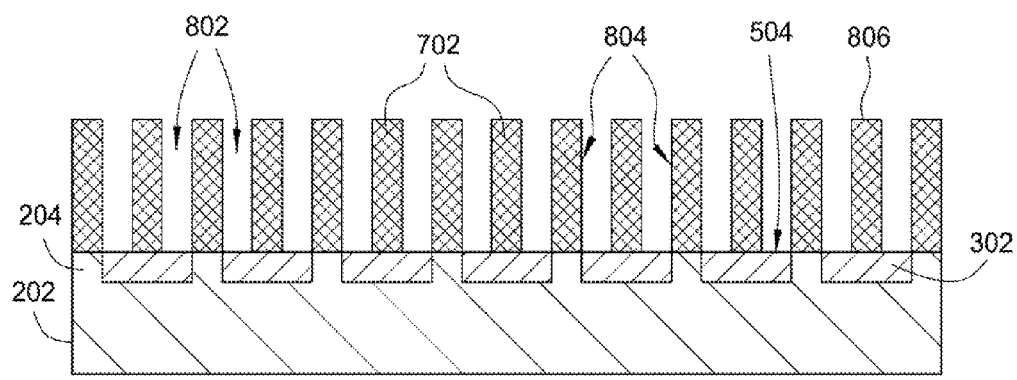
FIG. 14 illustrates a partial, cross-sectional view of a substrate having second fin structures formed thereon after a first fin structure etching process.

FIG. 14 illustrates a partial, cross-sectional view of the substrate 202 having the second fin structures 702 formed thereon after a first fin structure etching process. The first fin structures 302 may be selectively etched and recessed below a top surface 806 of the second fin structures 702. The selective etching of the first fin structures 302 results in the formation of one or more third recesses 802 which are generally defined by sidewalls 804 of the second fin structures 702.

The first fin structures 302 may be selectively etched such that the top surface 504 of the remaining portions of the first fin structures 302 are co-planar with the remaining portions of the mandrel structures 204. The first fin structure etching process may be performed by a dry plasma etching process and may be a time dependent anisotropic etching process. Suitable precursors for forming a plasma to selectively etch the first fin structures 302 include fluorocarbon containing gases, such as $CF_4$, $CHF_3$, and chlorine containing gases, such as $CL_2$. Oxygen containing gases, such as $O_2$, and nitrogen containing gases, such as $N_2$, may also be provided to enhance etch selectivity. In one embodiment, the first fin structures 302 may be etched in a selective etching chamber, such as one of the chambers 108a-108b.

Figure 15:
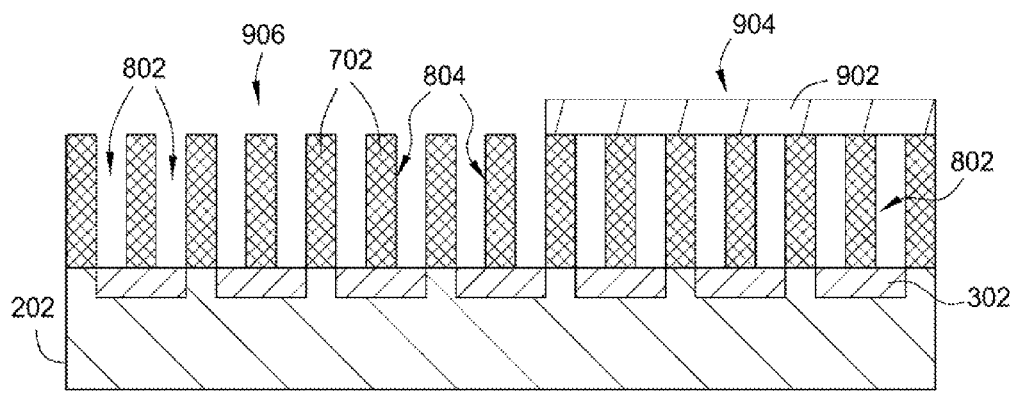
FIG. 15 illustrates a partial, cross-sectional view of a substrate having second fin structures formed thereon after a hardmask deposition process.

FIG. 15 illustrates a partial, cross-sectional view of the substrate 202 with the second fin structures 702 formed thereon after a hardmask deposition process. A hardmask layer 902 may be deposited over a portion of the substrate 202 to mask one or more of the second fin structures 702. Thus, a masked region 904 and an unmasked region 906 may be defined on the substrate 202. The second fin structures 702 disposed in the masked region 904 have the hardmask layer 902 disposed thereover and the second fin structures 702 in the unmasked region 906 are unmasked. The hardmask layer 902 may be formed from any suitable hardmask material, such as silicon nitride or the like.

Figure 16:
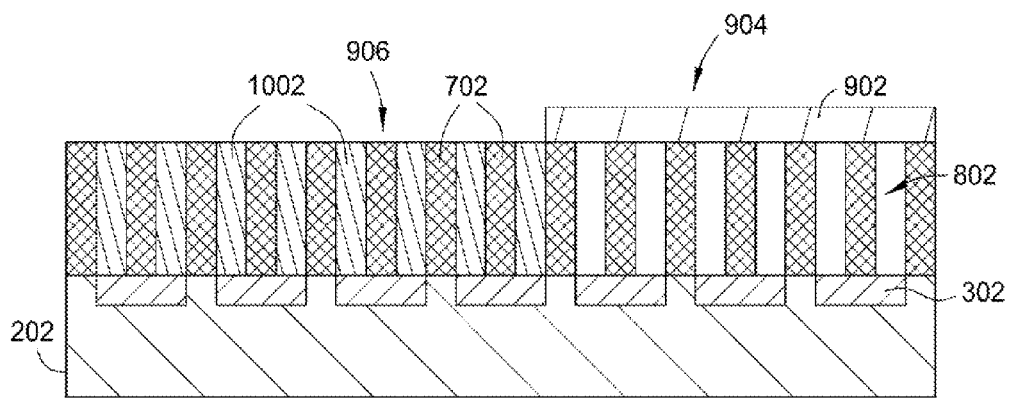
FIG. 16 illustrates a partial, cross-sectional view of a substrate having second fin structures formed thereon after a third fin structure deposition process.

FIG. 16 illustrates a partial, cross-sectional view of the substrate 202 having the second fin structures 702 formed thereon after a third fin structure deposition process. The third recesses 802 (Shown in FIG. 15) in the unmasked region 906 are filled with a third fin material to form one or more third fin structures 1002. The third fin structures 1002 are grown from the sidewalls 804 of the second fin structures 702 to fill the third recesses 802. As such, the third fin material may nucleate on the sidewalls 804 and grow laterally to fill the third recesses 802 between the second fin structures 702 in the unmasked region 906. As illustrated, the third recesses 802 in the masked region 904 covered by the hardmask layer 902 are not filled with the third fin structure material.

The third fin structure material is generally selected to minimize lattice mismatches and dislocations which may be generated at the interface of the second fin structures 702, i.e., the sidewalls 804, and the third fin structures 1002. For example, if the second fin structures 702 are formed from a germanium material, the third fin structures 1002 may be formed from a III-V material, however, other suitable materials may also be utilized. Similar to the embodiments described with regard to FIG. 10, the material of the third fin structures 1002 does not nucleate and grow from the remaining portions of the first fin structures 302, rather, the nucleation of the third fin structure material is limited to the sidewalls 804 of the second fin structures 702. In one example, the third fin structures 1002 are formed by an epitaxial deposition process. A chamber suitable for performing the epitaxial deposition process is a CENTURA® RP EPI chamber available from Applied Materials, Inc., Santa Clara, Calif. However, it is contemplated that other chambers from other manufacturers may also perform the processes described.

Figure 17:
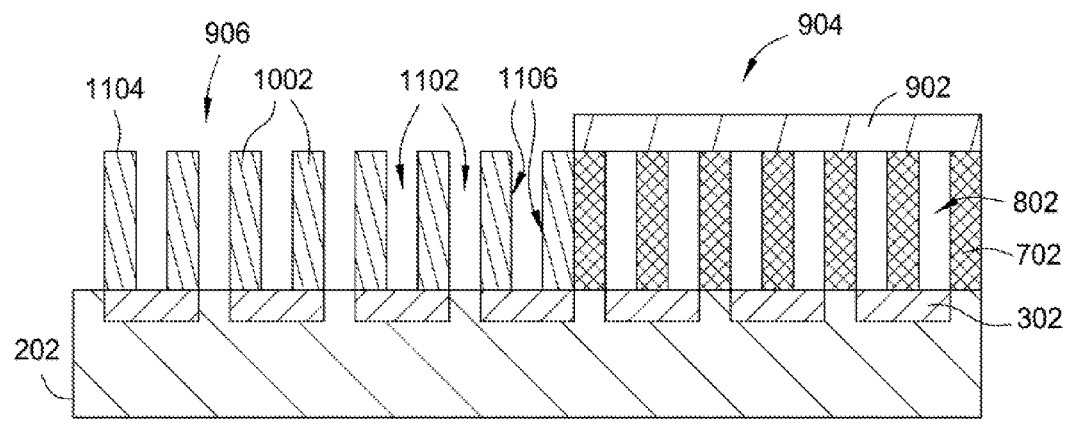
FIG. 17 illustrates a partial, cross-sectional view of a substrate having second fin structures and third fin structures formed thereon after a second fin structure etching process.

FIG. 17 illustrates a partial, cross-sectional view of the substrate 202 having the second fin structures 702 and the third fin structures 1002 formed thereon after a second fin structure etching process. The second fin structures 702 may be selectively etched and recessed below a top surface 1104 of the third fin structures 1002 in the unmasked region 906. The hardmask layer 902 covering the second fin structures 702 in the masked region 904 prevents etching of the second fin structures 702 in the masked region 904. The selective etching of the second fin structures 702 results in the formation of one or more fourth recesses 1102 which are generally defined by sidewalls 1106 of the third fin structures 1002.

The second fin structures 702 in the unmasked region 906 may be selectively etched such that remaining portions of the first fin structures 302 disposed within the fourth recesses 1102 are exposed. The second fin structure etching process may be performed by a dry plasma etching process and may be a time dependent anisotropic etching process. The first fin structure 302 may also serve as an endpoint material for stopping the second fin structure etching process. Suitable precursors for forming a plasma to selectively etch the first fin structures 302 include fluorocarbon containing gases, such as $CF_4$, $CHF_3$, and chlorine containing gases, such as $CL_2$ and the like. In one embodiment, the second fin structures 702 in the unmasked region 906 may be etched in a selective etching chamber, such as one of the chambers 108a-108b.

Figure 18:
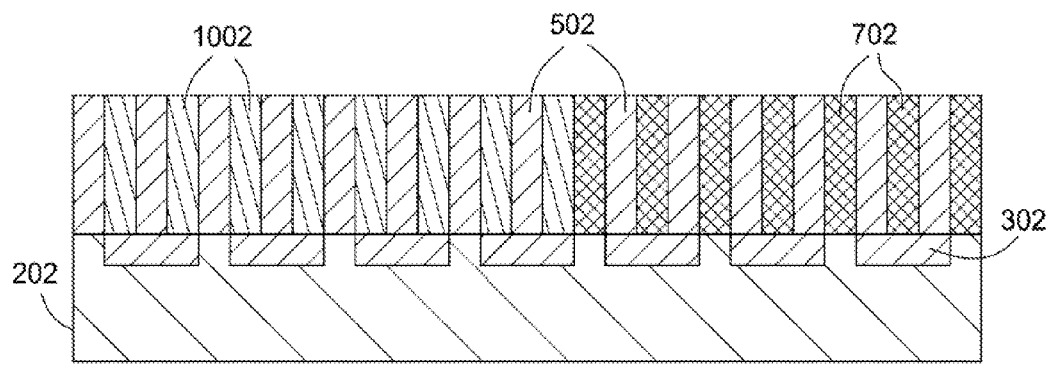
FIG. 18 illustrates a partial, cross-sectional view of a substrate having second fin structures and third fin structures formed thereon after a hardmask removal process and a dielectric deposition process.

FIG. 18 illustrates a partial, cross-sectional view of the substrate 202 having the second fin structures 702 and the third fin structures 1002 formed thereon after a hardmask removal process and dielectric deposition process. The hardmask layer 902 (Shown in FIG. 17) may be removed to expose the second fin structures 702. The hardmask layer 902 may be removed by a selective dry plasma etching process similar to the hardmask layer removal process described with regard to FIG. 12. After the hardmask layer 902 has been removed, the dielectric layer 502 may be deposited in the third recesses 802 and the fourth recesses utilizing the processes described with regard to FIG. 5.

Figure 19:
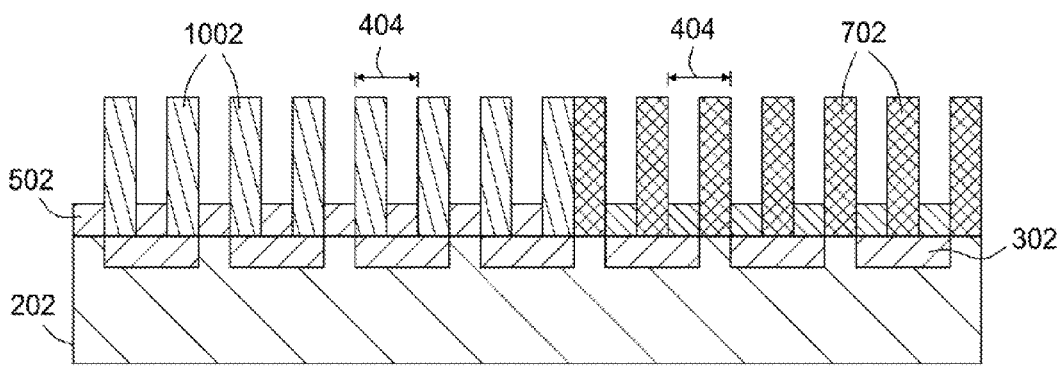
FIG. 19 illustrates a partial, cross-sectional view of a substrate having second fin structures and third fin structures formed thereon after a dielectric etching process.

FIG. 19 illustrates a partial, cross-sectional view of the substrate 202 having the second fin structures 702 and the third fin structures 1002 formed thereon after a dielectric etching process. The dielectric etching process is similar to the process described with regard to FIG. 6. The second fin structures 702 may be suitable for forming a Pfet structure and the third fin structures 1002 may be suitable for forming an Nfet structure in a CMOS device. As illustrated, the second pitch size 404 is maintained for both the second fin structures 702 and the third fin structures 1002 without utilizing multiple patterning lithography techniques. Additionally, the materials utilized to form the fin structures may transition from a silicon material to a III-V material in a manner that minimizes or prevents crystallographic dislocations and mismatches while forming suitable Pfet and Nfet structures.

While the foregoing is directed to embodiments of the present disclosure, other and further embodiments of the disclosure may be devised without departing from the basic scope thereof, and the scope thereof is determined by the claims that follow.

What is claimed is:

1. A method for forming a FinFET structure, comprising:
    forming at least a first mandrel structure and a second mandrel structure having a first pitch size on a substrate, wherein the first mandrel structure and the second mandrel structure define a recess therebetween;
    conformally depositing a fin material layer in the recess, wherein the fin material layer extends continuously from the first mandrel structure to the second mandrel structure, and wherein the fin material layer is selected from the group consisting of silicon, silicon germanium, germanium, and III-V materials;
    removing the first mandrel structure and the second mandrel structure to form at least a first fin structure and a second fin structure having a second pitch size less than the first pitch size; and
    depositing a dielectric layer over the fin material layer and the substrate.

2. The method of claim 1, wherein the substrate is a silicon substrate or a silicon-on-insulator substrate.

3. The method of claim 1, wherein the first pitch size is between about 20 nm and about 60 nm.

4. The method of claim 3, wherein the first pitch size is about 40 nm.

5. The method of claim 4, wherein the second pitch size is about 20 nm.

6. The method of claim 1, wherein the first mandrel structure and the second mandrel structure are formed from a material selected from the group consisting of silicon, silicon germanium, germanium, and III-V materials.

7. The method of claim 6, wherein the first mandrel structure and the second mandrel structure are formed from a silicon material.

8. The method of claim 7, wherein the fin material layer is a silicon germanium material.

9. A method of forming a FinFET structure, comprising:
   forming a plurality of silicon mandrel structures on a substrate, wherein a first pitch size between adjacent mandrel structures is between about 25 nm and about 55 nm;
   depositing a silicon germanium material layer over the plurality of silicon mandrel structures to form first fin structures, wherein a second pitch size between adjacent first fin structures is about half of the first pitch size;
   depositing a dielectric material in recesses formed between adjacent first fin structures;
   etching less than an entire amount of the dielectric material such that a portion of the dielectric material remains in the recesses; and
   depositing a germanium material in the recesses to form second fin structures.

10. The method of claim 9, wherein the silicon germanium material layer is epitaxially deposited.

11. The method of claim 9, wherein the dielectric material is an oxide material.

12. The method of claim 11, wherein the oxide material is deposited by a flowable oxide deposition process.

13. The method of claim 9, wherein the dielectric material is etched utilizing a dry etching process comprising a fluorocarbon containing plasma.

14. The method of claim 9, further comprising:
   contacting the portion of the dielectric material with an chlorine containing gas during formation of the second fin structures.

15. A method of forming a FinFET structure, comprising:
   forming a plurality of mandrel structures on a substrate;
   depositing a plurality of first fin structures adjacent sidewalls of the plurality of mandrel structures;
   removing the mandrel structures;
   depositing a dielectric material layer over the plurality of first fin structures;
   etching the dielectric material layer to form recesses between the plurality of first fin structures;
   depositing a plurality of second fin structures adjacent sidewalls of the plurality of first fin structures;
   depositing a plurality of third fin structures adjacent sidewalls of the plurality of second fin structures, wherein a chlorine containing gas is provided during the depositing a plurality of second fin structures and the depositing a plurality of third fin structures.

16. The method of claim 15, wherein the plurality of mandrel structures are a silicon material.

17. The method of claims 16, wherein the plurality of first fin structures are a silicon germanium material.

18. The method of claim 17, wherein the plurality of second fin structures are a germanium material.

19. The method of claim 18, wherein the plurality of third fin structures are a III-V material.

\* \* \* \* \*